United States Patent [19]

Raza et al.

[11] Patent Number: 5,986,489
[45] Date of Patent: *Nov. 16, 1999

[54] SLEW RATE CONTROL CIRCUIT FOR AN INTEGRATED CIRCUIT

[75] Inventors: S. Babar Raza, Sunnyvale; Lin-Shih Liu, Fremont; Hagop Nazarian, San Jose, all of Calif.

[73] Assignee: Cypress Semiconductor Corp., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/627,946

[22] Filed: Apr. 3, 1996

[51] Int. Cl.$^6$ .................................................... H03K 5/12
[52] U.S. Cl. .......................... 327/170; 327/108; 327/112; 326/82; 326/87
[58] Field of Search ................................... 327/108, 112, 327/134, 170, 380, 381; 326/17, 82, 87, 91

[56] References Cited

U.S. PATENT DOCUMENTS

| | | | |
|---|---|---|---|
| 5,013,940 | 5/1991 | Ansel | 307/473 |
| 5,066,872 | 11/1991 | Schenck | 307/443 |
| 5,099,148 | 3/1992 | McClure et al. | 307/443 |
| 5,111,075 | 5/1992 | Ferry et al. | 307/443 |
| 5,155,392 | 10/1992 | Nogle | 307/475 |
| 5,194,760 | 3/1993 | Braun et al. | 307/263 |
| 5,216,293 | 6/1993 | Sei et al. | 307/443 |
| 5,245,230 | 9/1993 | Ohri et al. | 307/572 |
| 5,285,116 | 2/1994 | Thaik | 307/443 |
| 5,331,220 | 7/1994 | Pierce et al. | 307/475 |
| 5,355,029 | 10/1994 | Houghton et al. | 307/443 |
| 5,367,206 | 11/1994 | Yu et al. | 326/26 |
| 5,414,379 | 5/1995 | Kwon | 327/170 |
| 5,438,503 | 8/1995 | Stanley | 363/43 |
| 5,483,177 | 1/1996 | Van Lieverloo | 326/27 |
| 5,489,858 | 2/1996 | Pierce et al. | 326/56 |
| 5,534,790 | 7/1996 | Huynh et al. | 326/27 |
| 5,561,081 | 10/1996 | Lui et al. | 327/380 |
| 5,598,107 | 1/1997 | Cabuk | 326/27 |
| 5,657,456 | 8/1997 | Gist et al. | 395/280 |
| 5,699,000 | 12/1997 | Ishikuri | 327/108 |
| 5,742,193 | 4/1998 | Colli et al. | 327/170 |

Primary Examiner—Tim Callahan
Assistant Examiner—Jung Ho Kim
Attorney, Agent, or Firm—Blakely, Sokoloff, Taylor & Zafman LLP

[57] ABSTRACT

A slew rate control circuit to control output slew rate according to a programmable reference signal. A slew rate control circuit limits the slew rate of a plurality output buffers according to a signal received from a programmable slew rate control reference.

8 Claims, 5 Drawing Sheets

SLEW RATE CONTROL CIRCUIT FOR AN INTEGRATED CIRCUIT

FIELD OF THE INVENTION

The present invention relates to the field of output buffer control; more particularly, the present invention relates to output buffer slew rate control.

BACKGROUND OF THE INVENTION

Digital circuits on an integrated circuit (IC) generally detect the logic states of input signals and provide output signals responsive thereto. Because output signals are often used as inputs to subsequent logic devices, the output signals must have sufficient voltage and current to drive the subsequent devices. A common practice is to buffer output signals by using transistors to ensure adequate output signal strength. However, providing each output signal with its own output buffer and driver, supplied by a power supply can create noise problems when many outputs switch state at once. For example, when several output buffers switch from one binary state to another, the output buffers and drivers tend to draw significant current (even CMOS buffer and drivers tend to draw current when the buffers switch states), which in turn tends to cause, through the inductance of the package of the IC, significant noise from the switching of signals on the output conductors of the package. Moreover, the reference voltages, such as $V_{cc}$ and $V_{ss}$, supplied on the IC tend to deviate from their normal voltage levels when many outputs switch state at once. These problems increase when the switching rate of operation for the buffers and drivers, or the number of buffers and drivers that are switching, increases; that is, when the frequency of the switching increases, more noise results and more deviations of $V_{cc}$ and $V_{ss}$ (from normal voltage levels) also results.

A solution for these problems in the prior art has involved the use of slew rate control for the output buffers. The control of slew rate allows a designer of an IC to slow the speed of an IC (when high speed is not necessary) by driving the buffers with less current. In turn, this reduces the noise generated by the IC and also tends to reduce the voltage deviations for the IC's internal reference voltages (as well as the effect on the off-chip power supply reference voltages). However, this solution is generally based on a chip designer's assumption of a worst case scenario for the number of output buffers which will be switching. This slew rate control in the prior art is independent of the number of outputs which may be switching at any one time.

Therefore, it is desirable to provide an output buffer control device that provides better slew rate control for several output buffers, and allows the designer or chip user to reduce noise, power consumption, or increase speed, without sacrificing performance.

SUMMARY OF THE INVENTION

A slew rate control circuit to control output slew rate according to a programmable reference signal and the number of outputs which are switching is described. A slew rate control circuit limits the slew rate of output buffers according to a signal received from a programmable slew rate control reference.

In one embodiment, the apparatus of the present invention includes a global slew rate control device which is coupled to a plurality of output buffers. In one embodiment, all output buffers may be coupled to a single (global) slew rate control device. This slew rate control device is coupled to a programmable slew rate control circuit which provides a signal that controls the slew rate of the output buffer by controlling the current provided by the slew rate control device. In another embodiment, one slew rate control device may be coupled to a first plurality of output buffers, and another slew rate control device may be coupled to a second plurality of output buffers.

According to another embodiment of the invention, the method of the invention includes the steps of providing a programmable slew rate control signal to a slew rate control device, and bussing a signal and/or current from said slew rate control device to a plurality of output buffers. In this method, when fewer output buffers are switching, then the slew rate (of the fewer buffers) is much faster than when all output buffers are switching, and yet noise will still be low because only one output buffer is switching. There will be substantially the same noise as in the prior art when all outputs are switching and the slew rate will be as fast as the prior art.

The present invention provides a self-compensating mechanism for the slew rate to be lower when more outputs are switching, and this compensates for the increased noise which occurs when more outputs are switching. When fewer outputs are switching, the slew rate is increased without significantly increasing noise since fewer outputs being switched means that less noise is generated. Thus, the slew rate is controlled in such a manner that is dependent on the number of outputs which are switching.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

In the following description, numerous details are set forth, such as distances between components, types of materials, etc. It will be apparent, however, to one skilled in the art, that the present invention may be practiced without these specific details. In other instances, well-known structures and devices are shown in block diagram form, rather than in detail, in order to avoid obscuring the present invention.

Figure 1:
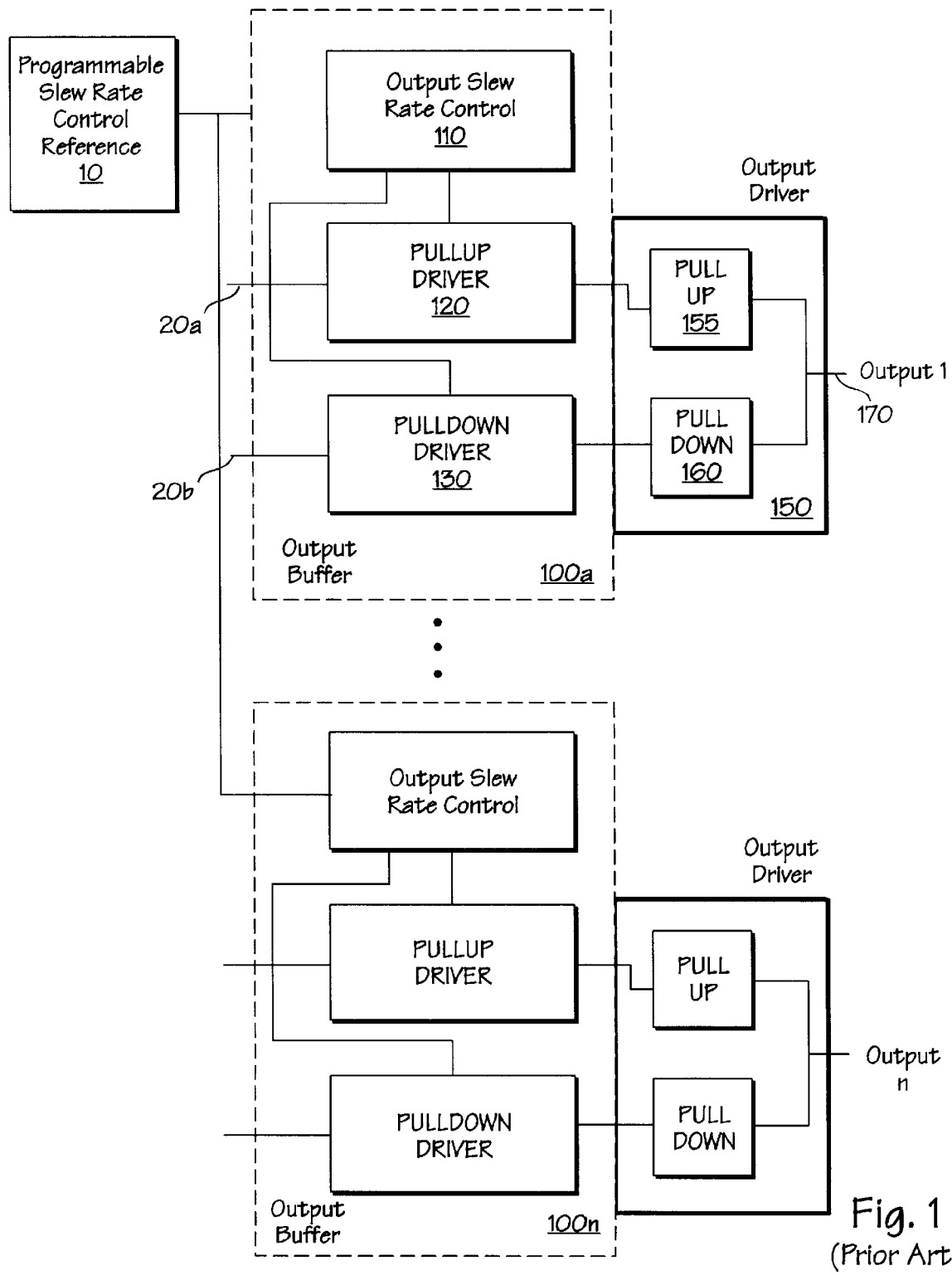
FIG. 1 shows an output slew rate control circuit according to the prior art.

Referring now to FIG. 1, an output slew rate control circuit according to the prior art is shown. A programmable slew rate control reference circuit 10 provides a control signal to a plurality of output buffers 100a through 100n. Each output buffer, such as output buffer 100a, contains an output slew rate control device 110, a pull-up driver 120, and a pull-down driver 130. The pull-up driver 120 and the pull-down driver 130 provide outputs of the output buffer 100, that are received by an output driver 150. The output driver 150 contains a pull-up device 155 and a pull-down device 160. The pull-up device 155 receives the pull-up signal from the pull-up driver 120, and the pull-down device 160 receives the pull-down signal from the pull-down driver 130. The pull-up and pull-down devices within the output driver 150 provide an output signal 170. Because there are a plurality of output buffers and a plurality of output drivers, each output driver being associated with and receiving signals from a corresponding output buffer, a plurality of output signals are generated. The pull-up and pull-down drivers receive signals 20a and 20b that represent particular logic states generated by other components on the chip, but which are of insufficient voltage and/or current to drive subsequent logic circuits which are coupled to the output and which may be on another integrated circuit (IC) or on a printed circuit board. Output buffers and output drivers are provided to supply the necessary voltage and current needed to drive the subsequent logic circuits.

Figure 2:
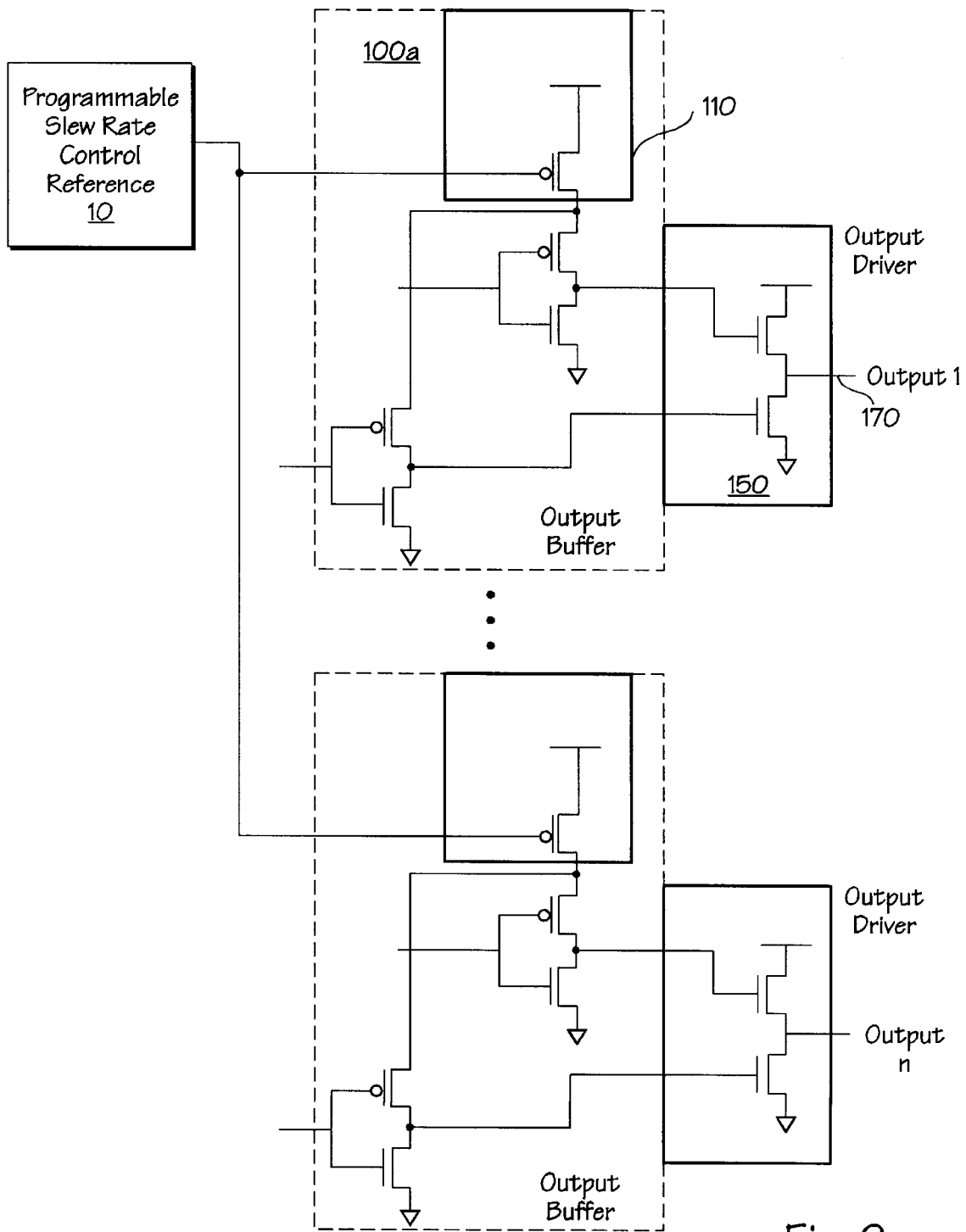
FIG. 2 shows an example of the prior art circuit of FIG. 1 in greater detail.

FIG. 2 shows an example of the prior art circuit of FIG. 1 in greater detail. Within each output buffer, such as buffer 100a, the pull-up driver and pull-down drivers are each comprised of a pair of transistors, (one NMOS and one PMOS transistor each) that provide the control signal necessary to drive the output drivers. Each output driver comprises two NMOS transistors in series between a reference voltage (e.g. a $V_{cc}$ of+5V) and another potential (e.g., ground) each output driver transistor being driven by a control signal received from the output of the corresponding pull-up and pull-down drivers. According to the prior art device shown in FIGS. 1 and 2, each output buffer has a dedicated output slew rate control device 110 consisting of a single PMOS transistor, the source terminal of which is connected to the $V_{cc}$ voltage, the drain of which is connected to the source of the PMOS transistor in each of the pull-up and pull-down drivers, and the gate of which is connected to the external programmable slew rate control reference circuit 10.

Figure 3:
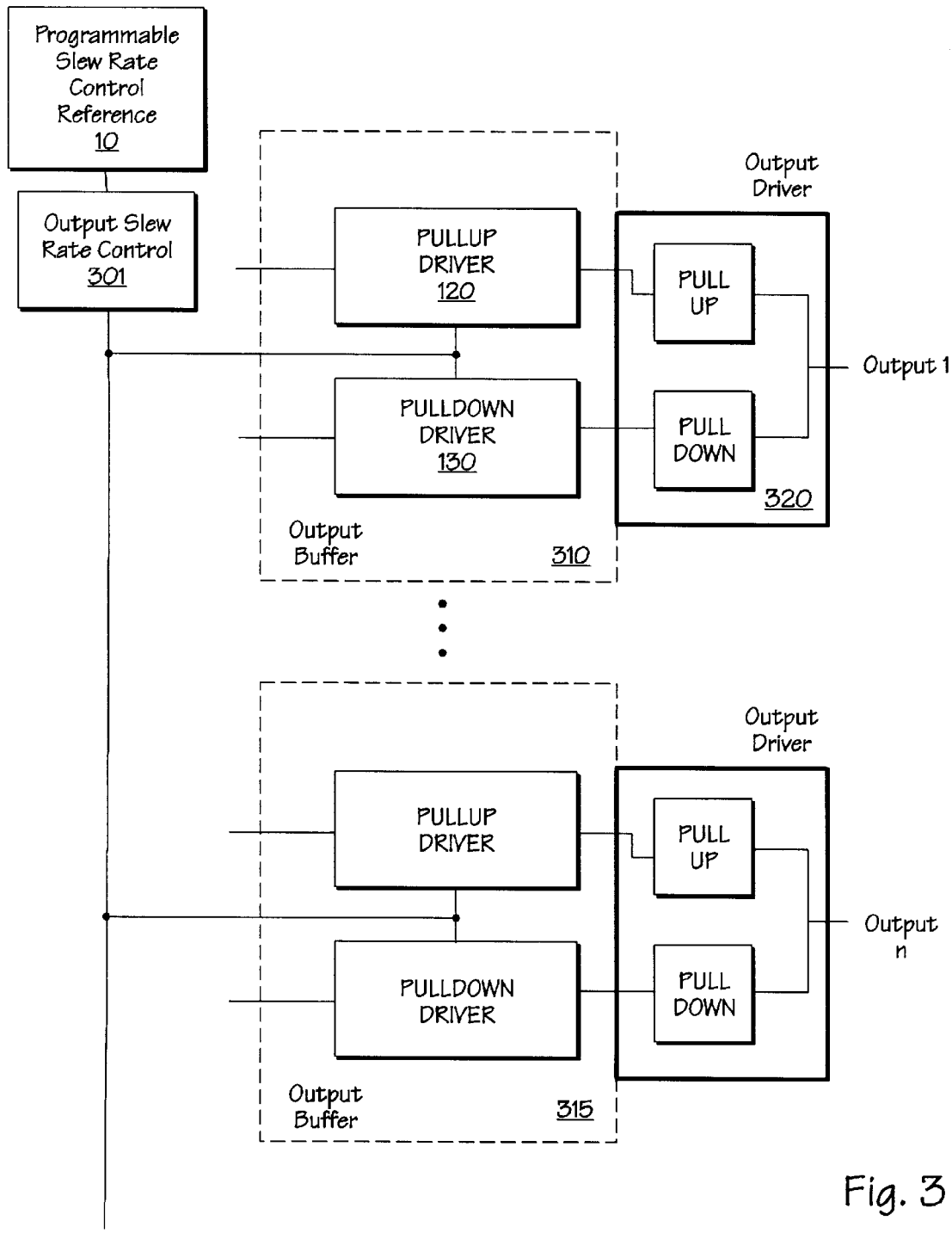
FIG. 3 shows an output slew rate control circuit according to one embodiment of the present invention.

Referring now to FIG. 3, an output slew rate control circuit according to one embodiment of the present invention is shown. As shown in FIG. 3, a single output slew rate device 301 is coupled to a plurality of output buffers 310 through 315, each output buffer supplying control signals to an output driver such as driver 320. The output slew rate control circuit may be considered a global slew rate control because it controls the slew rate for a plurality of buffers. The output slew rate control 301 is coupled to a programmable slew rate control reference generator 10, which is similar, if not identical, to the programmable slew rate control reference generator in the prior art. This reference generator 10 is programmable such that the slew rate of the output buffers may be adjusted, by programming (e.g., via laser fuses, electrical fuses, or electrically programmable elements on the IC), to provide a desired slew rate. The reference generator 10, the output slew rate control 301 and the plurality of output buffers and corresponding output drivers are on the same IC, and each of these output drivers typically has large transistors which are coupled to an output bonding pad on the IC. In one embodiment of the present invention, the global output slew control circuit is larger than the dedicated output slew rate control circuits 110 of the prior art, and therefore provides one larger and stable power reference which is distributed to the plurality of output buffers.

Figure 4:
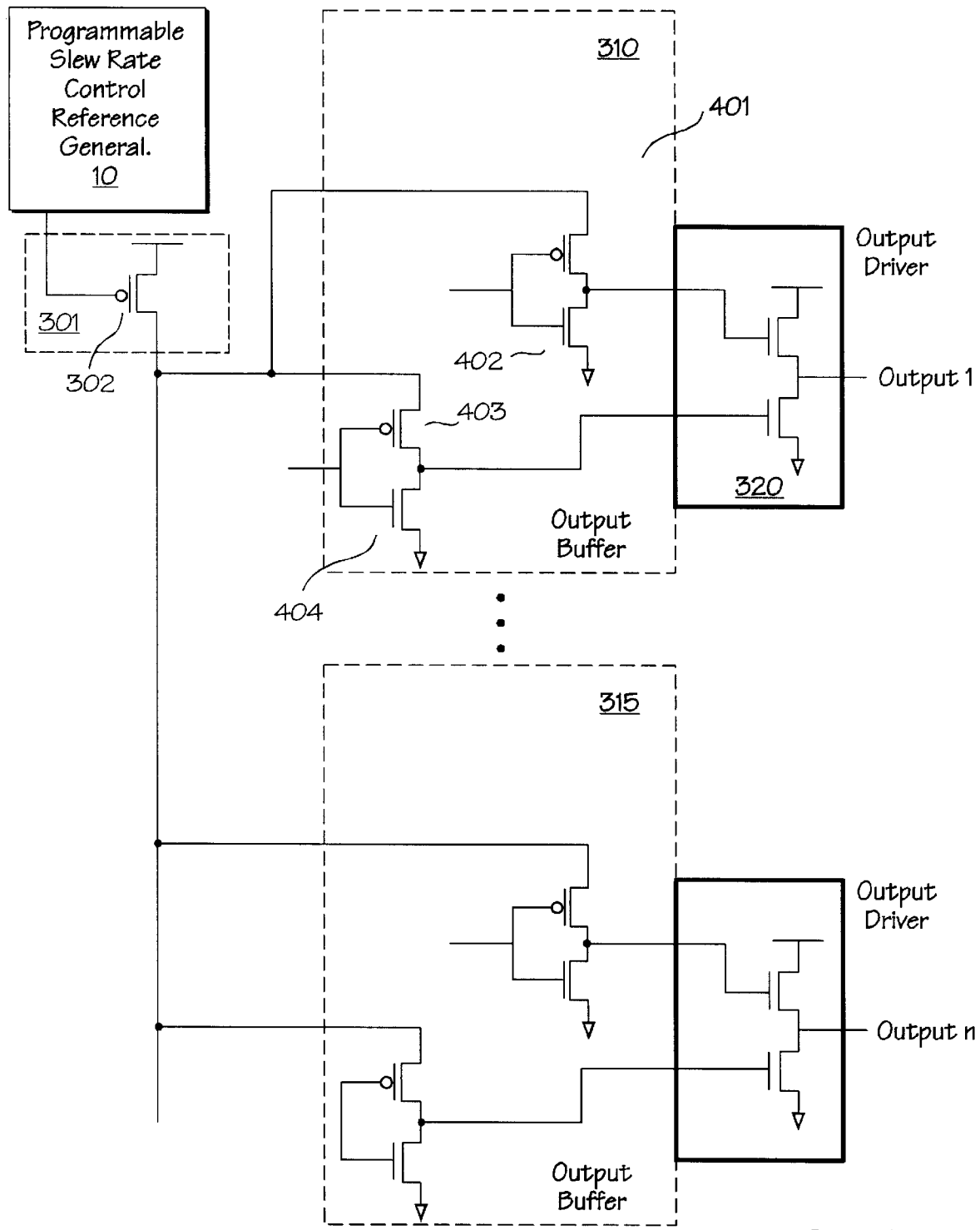
FIG. 4 shows one embodiment of the present invention in greater detail.

Referring now to FIG. 4, one embodiment of the present invention is shown in greater detail. A programmable slew rate control reference generator 10 supplies a control signal to a slew rate device 302 which provides the output slew rate control 301. The slew rate device 302 in the embodiment shown in FIG. 4 comprises a transistor having a source terminal tied to a reference voltage (e.g., a positive $V_{cc}$) and a gate coupled to the control signal from the programmable slew rate control reference generator 10. The drain terminal of the slew rate device transistor 302, which may be termed "virtual $V_{cc}$", supplies a stable reference signal to a plurality of output buffers as shown in FIG. 4. Each of the output buffers shown in FIG. 4 comprise two CMOS pairs of transistors 401, 402 and 403, 404 in series, with the PMOS transistor in each pair receiving the virtual $V_{cc}$ signal. The output buffers do not need dedicated output slew rate control circuits, since the slew rate of the output buffer is controlled globally by the slew rate device 302. Depending on the number of output buffers and the frequency and timing of the output signals, the present invention can provide either higher speed, lower noise, or a combination of higher speed and lower noise.

For example, if each output buffer in the prior art had an output slew rate control transistor which was 5 microns wide and 1 micron long (in gate dimensions), and there were 10 such output buffers, then according to the invention, the global slew rate control transistor for 10 output buffers would be 10 times the size of the prior art output slew rate control transistor. That is, the gate dimensions of the global slew rate control transistor would be 50 microns wide and 10 microns long. This global transistor would then provide enough current (as in the prior art) when all 10 outputs are switching and would provide considerably more current when only one output (or a few of the 10 outputs in this example) is switching and thus, the slew rate is increased when one output switches relative to the slew rate when all outputs are switching. While actual performance depends on the frequency of the output, performance, for both speed and noise, is markedly improved when the outputs are not all switching simultaneously, which is often the case.

The size of the global slew rate device may be selected based on the noise parameters desired and the speed required. The size may also be determined based on the number of outputs, assuming a worst case situation in which all outputs are switching simultaneously. In the example described above, when the global slew rate device (e.g., transistor 302) is controlling 10 outputs, it will typically be 10 times the size of the dedicated slew rate device which controlled each output buffer in the prior art.

Figure 5:
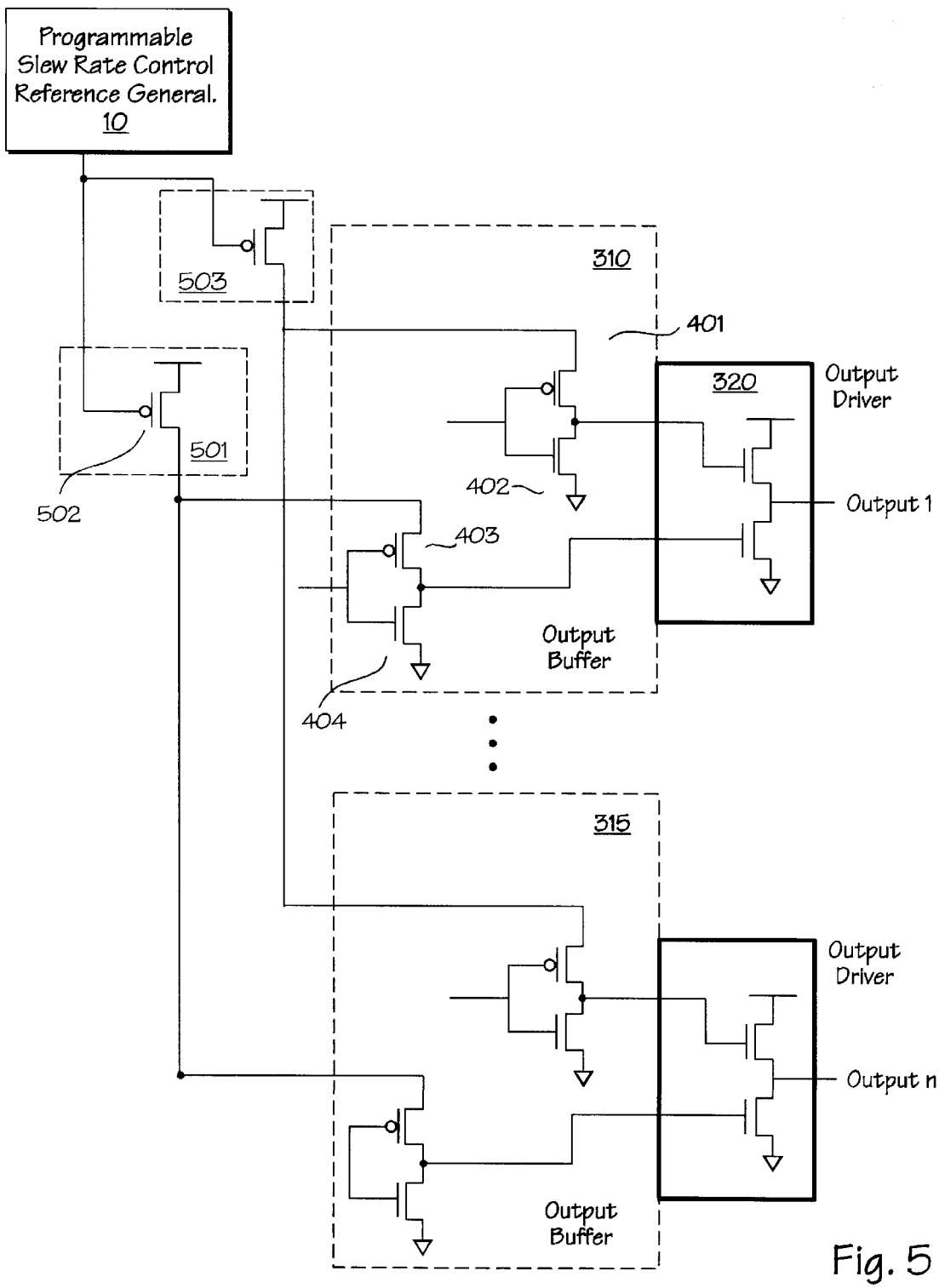
FIG. 5 shows an alternative output slew rate control circuit according to further embodiment of the present invention.

Referring now to FIG. 5, an alternate embodiment of the present invention is shown in which more than one virtual nodes or virtual terminals, having substantially equal voltages or signals, provide level control to a plurality of output buffers. In the embodiment shown in FIG. 5, a first slew rate device 501 provides a first control signal to a plurality of pull-down buffers while a second slew rate device 503 provides a second control signal to a plurality of pull-up buffers. Each of the slew rate devices 501 and 503 contains a PMOS transistor, 502 and 504 respectively, having a source terminal tied to a reference voltage and a gate coupled to the control signal from the programmable slew rate control reference generator 10.

The drain terminal of the transistor within the first slew rate device 501 is coupled to the source terminals of the PMOS transistors within the pull-down buffers of the output buffers. Similarly, the drain terminal of the transistor within the second slew rate device 503 is coupled to the source terminals of the PMOS transistors within the pull-up buffers of the output buffers. Thus, the first and second slew rate devices 501 and 503 provide independent reference or control signals for the source terminals of the PMOS transistors within the output buffers. In many applications, a positive constant voltage or "virtual Vcc" is supplied by the slew rate devices 501 and 503, providing independent control of the pull-up and pull-down buffers and allowing greater protection against voltage level variation as larger numbers of buffers switch states, or as buffers increase switching rates.

It will be recognized by one of ordinary skill that the global slew rate device may comprise one or more transistors, and need not be limited to NMOS or PMOS types. In those embodiments in which more than one output buffer is included, the global slew rate device may be significantly larger than the output slew rate control device of the prior art, because the virtual $V_{cc}$ signal is supplied to more than one output buffer. However, although larger, the global slew rate device of the present invention need not be as large as the sum of the die areas occupied in the prior art by the multiplicity of output slew rate control devices, if it is certain that fewer than all output signals will be switching at the same time.

We claim:

1. An integrated circuit, comprising:
   a plurality of output buffers, each having an associated pull-up driver and pull-down driver; and
   a transistor coupled to each of said pull-up drivers and pull-down drivers and configured to receive a slew rate control signal and to couple a first voltage supply to said pull-up drivers and pull-down drivers in response to said slew rate control signal.

2. An integrated circuit as in claim 1 wherein each of said plurality of output buffers is coupled to a corresponding one of a plurality of output drivers.

3. An integrated circuit as in claim 2 wherein each of said plurality of output drivers comprises a pull-up device and a pull-down device, the pull-up device of each output driver being coupled to the pull-up driver of the corresponding output buffer and the pull-down device of each output driver being coupled to the pull-down driver of the corresponding output buffer.

4. An integrated circuit as in claim 3 wherein each of the pull-up and pull-down drivers of said plurality of output buffers each comprise a pair of transistors.

5. An integrated circuit as in claim 4 wherein each of said pairs of transistors is a CMOS inverter.

6. A method, comprising:
   providing a programmable slew rate control signal to a first output slew rate control circuit, said first output slew rate control circuit comprising a transistor;
   providing, in response to the programmable slew rate control signal, a first output control signal from the first output slew rate control circuit to a plurality of pairs of pull-up drivers and pull-down drivers, each pair comprising one of a plurality of output buffers, wherein said first output control signal is generated by the transistor, which is coupled to each of the pull-up and pull-down drivers, to couple a first voltage supply to said pull-up drivers and said pull-down drivers.

7. The method of claim 6 wherein each of the plurality of output buffers is coupled to a corresponding one of a plurality of output drivers, each of the output drivers comprising a pull-up device and a pull-down device, the method further comprising providing a first output signal to the pull-up device of at least one of the output drivers from the pull-up driver of the corresponding output buffer and providing a second output signal to the pull-down device of the at least one output driver from the pull-down driver of the corresponding output buffer in response to the first output control signal.

8. The method of claim 6 further comprising outputting an output signal from one of said pull-up or pull-down drivers in response to the programmable slew rate control signal.

* * * * *